US008526232B2

(12) United States Patent
Min et al.

(10) Patent No.: US 8,526,232 B2
(45) Date of Patent: Sep. 3, 2013

(54) NONVOLATILE MEMORY DEVICE USING VARIABLE RESISTIVE ELEMENT

(75) Inventors: Byung-Jun Min, Suwon-si (KR); Hoi-Ju Chung, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 166 days.

(21) Appl. No.: 13/085,453

(22) Filed: Apr. 12, 2011

(65) Prior Publication Data
US 2011/0267876 A1 Nov. 3, 2011

(30) Foreign Application Priority Data

Apr. 28, 2010 (KR) ........................ 10-2010-0039485

(51) Int. Cl.
*G11C 11/34* (2006.01)
(52) U.S. Cl.
USPC .................................................. 365/185.13
(58) Field of Classification Search
USPC ............... 365/200, 194, 185.18, 185.13, 148, 365/163
See application file for complete search history.

(56) References Cited

U.S. PATENT DOCUMENTS

| 6,490,208 | B2 | 12/2002 | Yoon | |
|---|---|---|---|---|
| 2003/0202417 | A1* | 10/2003 | Lee et al. | 365/230.03 |
| 2009/0316512 | A1* | 12/2009 | Terzioglu et al. | 365/230.03 |
| 2010/0246299 | A1* | 9/2010 | Iwai et al. | 365/200 |

FOREIGN PATENT DOCUMENTS

| JP | 2006-0139856 | 6/2006 |
|---|---|---|
| KR | 1020020002133 A | 1/2002 |
| KR | 1020020019171 A | 3/2002 |

* cited by examiner

*Primary Examiner* — Alexander Sofocleous
*Assistant Examiner* — Hien Nguyen
(74) *Attorney, Agent, or Firm* — Volentine & Whitt, PLLC

(57) ABSTRACT

A nonvolatile memory device that employs a variable resistive element includes: a memory cell array having a plurality of memory cells; a first circuit block that is disposed at one side of the memory cell array and performs a first operation on the memory cells; a second circuit block that is disposed at the other side of the memory cell array and performs a second operation on the memory cells, wherein the second operation is different from the first operation; and a redundancy block that is disposed closer to the second circuit block than the first circuit block, and which compares a repair address of a repaired memory cell among the plurality of memory cells with an input address to then generate a redundancy control signal, and to supply the redundancy control signal to the first circuit block and the second circuit block.

20 Claims, 12 Drawing Sheets

NONVOLATILE MEMORY DEVICE USING VARIABLE RESISTIVE ELEMENT

CROSS-REFERENCE TO RELATED APPLICATION

This application claims priority from Korean Patent Application No. 10-2010-0039485 filed on Apr. 28, 2010 in the Korean Intellectual Property Office, and all the benefits accruing therefrom under 35 U.S.C. 119, the contents of which are hereby incorporated by reference herein in their entirety.

BACKGROUND

1. Field of the Inventive Concept

The present inventive concept relates to a nonvolatile memory device using a variable resistive element.

2. Description of the Related Art

In general, examples of a nonvolatile memory device that uses a resistance material include a resistive Random Access Memory (RRAM), a phase change RAM (PRAM), a magnetic RAM (MRAM), and the like. While a dynamic RAM (DRAM) or a flash memory stores data using an electric charge, a nonvolatile memory device that uses a resistance material stores data using a change in resistance of a variable resistive material (RRAM), a change in state of a phase change material (PRAM), such as a chalcogenide alloy, and a change in resistance of a magnetic tunnel junction (MTJ) thin film due to a magnetization state of a ferromagnetic substance (MRAM).

In a phase-change memory cell, for example, when a phase change material is heated and then cooled, its state rapidly changes into a crystalline state or an amorphous state. The phase change material in the crystalline state has low resistance and phase change material in the amorphous state has high resistance. Thus, the crystalline state is referred to as a set state and stores a data "0" defined as set data, while the amorphous state is referred to as a reset state and stores a data "1" defined as reset data or data.

Meanwhile, in an input/output (IO) repair scheme of a phase change memory device, a failed memory column is replaced by a redundancy memory column. A phase change memory device may simultaneously repair at least one failed memory column with at least one redundancy memory column according to the IO repair mode. For example, when the IO repair mode is a ×1 mode, memory columns are repaired in units of one column. When the IO repair mode is a ×2 mode, memory columns are repaired in units of two columns.

In addition, a first circuit block of writing data in a phase change memory cell may be arranged to be spaced apart from a second circuit block of reading data from a phase change memory cell. That is to say, the first circuit block and the second circuit block may not be adjacent to each other. For example, the first circuit block may be disposed at one side of a memory cell array and the second circuit block may be disposed at the other side of the memory cell array.

When a write operation or a read operation is performed on a particular memory cell, it is necessary to know whether the particular memory cell has failed or not. That is to say, repair information should be provided to the first circuit block and the second circuit block. In order to provide repair information to the first circuit block and the second circuit block spaced apart from each other, a layout, such as an array of wires, of a memory cell array may become complicated, or a block area for repairing may become larger. That is to say, the repairing of failed memory cells may not be efficiently performed.

SUMMARY

The present inventive concept provides a nonvolatile memory device using a variable resistive element having improved repair efficiency.

According to an aspect of the present inventive concept, there is provided a nonvolatile memory device using a variable resistive element. The nonvolatile memory includes a memory cell array having a plurality of memory cells; a first circuit block that is disposed at one side of the memory cell array and which is configured to perform a first operation on the memory cells; a second circuit block that is disposed at the other side of the memory cell array and which is configured to perform second operation on the memory cells, wherein the second operation is different from the first operation; and a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block.

According to another aspect of the present inventive concept, there is provided a nonvolatile memory device including a memory cell array including: a write global bit line, a read global bit line, local bit lines selectively coupled to the write global bit line and the read global bit line, and a plurality of memory cells coupled to the local bit lines; a write block that is disposed at a first side of the memory cell array and coupled to the write global bit line and includes a latch; a read block that is disposed at a second side of the memory cell array and is coupled to the read global bit line; and a redundancy block that is disposed at an opposite side of the read block from the memory cell array, and which is configured to compare a repair address of a repaired memory cell among the plurality of memory cells with an input address, and to then generate a redundancy control signal and supply the redundancy control signal to the latch.

BRIEF DESCRIPTION OF THE DRAWINGS

The above and other features and advantages of the present inventive concept will become more apparent by describing in detail preferred embodiments thereof with reference to the attached drawings as follows.

DETAILED DESCRIPTION OF THE EMBODIMENTS

Figure 1:
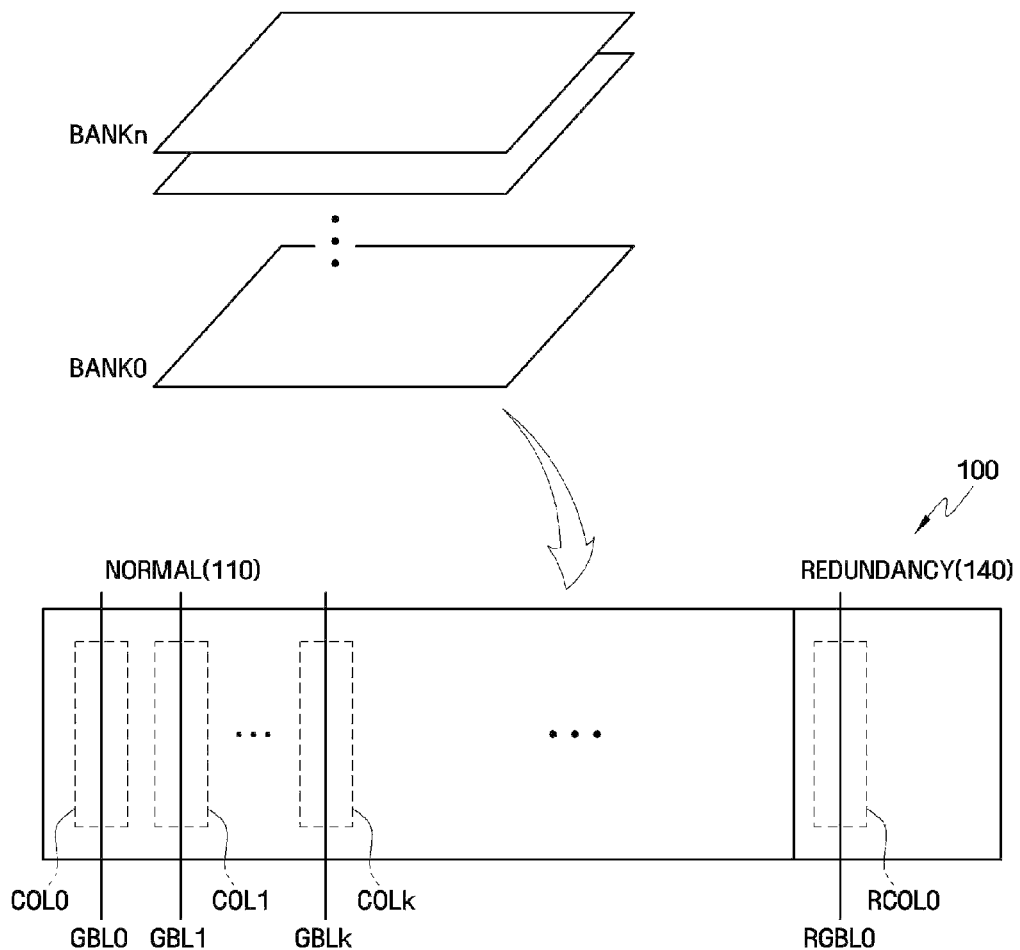
FIG. 1 is a block diagram illustrating an example of an embodiment of a nonvolatile memory device.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Throughout the drawings and written description, like reference numerals will be used to refer to like or similar elements. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The following description is directed to embodiments of the present inventive concept using phase change random access memory (PRAM) devices. However, it will be understood by those of ordinary skill in the art that the present inventive concept can be applied to nonvolatile memory devices that use resistance materials, such as resistive random access memory (RRAM) devices, ferroelectric random access memory (FRAM) devices, and the like.

Exemplary embodiments of the present inventive concept are described herein with reference to cross-section illustrations that are schematic illustrations of idealized embodiments (and intermediate structures) of the present inventive concept. As such, variations from the shapes of the illustrations as a result, for example, of manufacturing techniques and/or tolerances, are to be expected. Thus, exemplary embodiments of the present inventive concept should not be construed as limited to the particular shapes of regions illustrated herein but are to include deviations in shapes that result, for example, from manufacturing.

FIG. 1 is a block diagram illustrating an example of an embodiment of a nonvolatile memory device.

Referring to FIG. 1, the illustrated nonvolatile memory device may include a plurality of memory banks BANK0-BANKn. As shown, the plurality of memory banks BANK0-BANKn may be arranged in a stack type. One memory bank 100 among the plurality of memory banks BANK0-BANKn illustrated in FIG. 1 by way of example may include a normal memory array 110 and a redundancy memory array 140.

Normal memory array 110 may include a plurality of memory columns COL0-COLk. The memory columns COL0-COLk mean a plurality of memory cells coupled to one bit line. A memory column, e.g., COL0, among the memory columns COL0-COLk, may include a plurality of memory cells coupled to a global bit line, e.g., GBL0, among the global bit lines GBL0-GBLk.

In addition, redundancy memory array 140 may include at least one redundancy memory column RCOL0. The redundancy memory column RCOL0 refers to a plurality of memory cells coupled to a redundancy bit line. For example, the memory columns RCOL0 may include a plurality of memory cells coupled to the global bit line RGBL0.

If there is a failed memory column, e.g., COL0 in the normal memory array 110, the failed memory column COL0 may be repaired with the redundancy memory column RCOL0.

Figure 2:
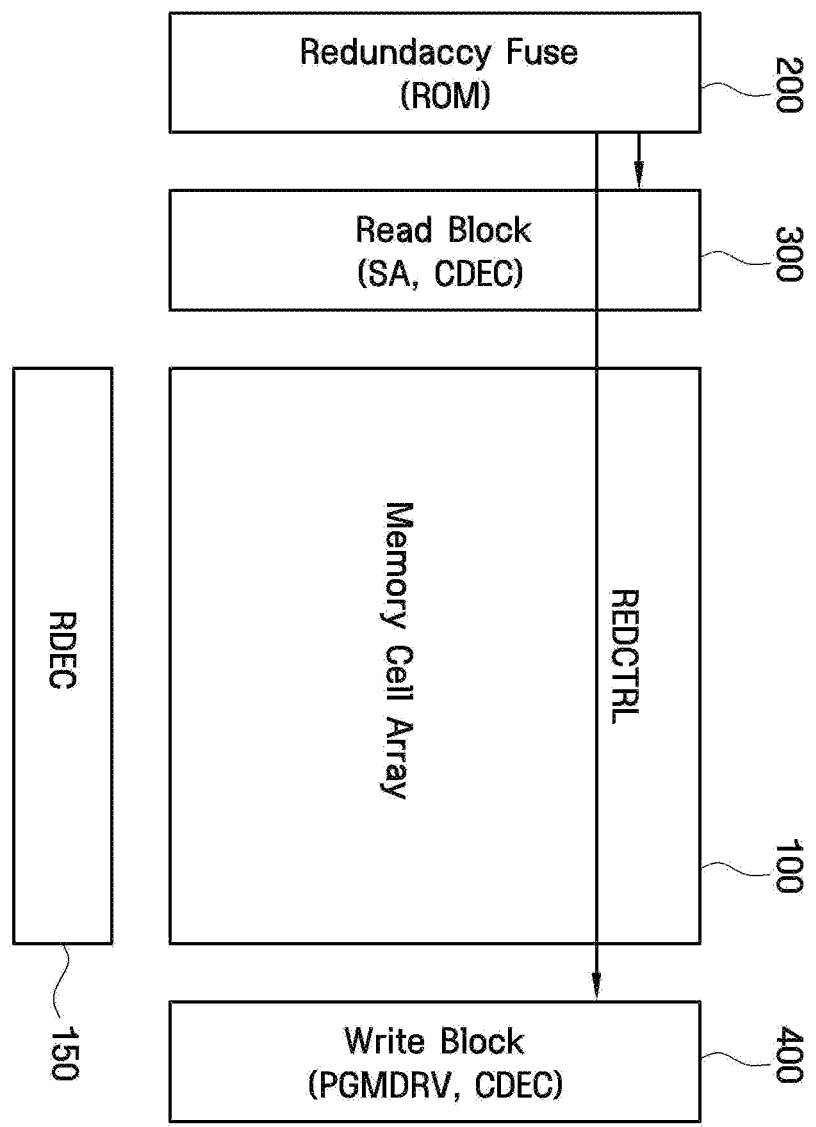
FIG. 2 is a high level block diagram illustrating an example of an embodiment of a nonvolatile memory device according to one or more aspects of the present inventive concept.

FIG. 2 is a high level block diagram illustrating an example of an embodiment of a nonvolatile memory device according to one or more aspects of the present inventive concept.

Referring to FIG. 2, the illustrated nonvolatile memory device may include memory cell array 100, a row decoder (RDEC) 150, a first circuit block 400, a second circuit block 300, and a redundancy block 200.

As described above, memory cell array 100 includes a normal memory array (shown in FIG. 1 as normal memory array 110) and a redundancy memory array (shown in FIG. 1 as redundancy memory array 140).

Although not shown in FIG. 1 or 2, normal memory array 110 and redundancy memory array 140 may each include a plurality of phase-change memory cells. A phase-change memory cell may include a variable resistive element having a phase-change material having two different resistance levels corresponding to a crystal state or an amorphous state, and an access element that controls the shot-through current flowing through the variable resistive element. Here, the access element may be a diode connected to the variable resistive element in series. The phase-change nonvolatile memory device using a diode as the access element AC is referred to as a diode-controlled PRAM cell. In an embodiment, GeSbTe, consisting of germanium (Ge), antimony (Sb) and tellurium (Te), is used as the phase-change material. In addition, the phase-change material may use various materials, for example, including two atomic compounds, such as GaSb, InSb, InSe, $Sb_2Te_a$, or GeTe, three atomic compounds, such as GeSbTe, GaSeTe, InSbTe, $SnSb_2Te_4$, or InSbGe, or four atomic compounds, such as AgInSbTe, (GeSn)SbTe, GeSb (SeTe), or $Te_{81}Ge_{15}Sb_2S_2$. Specifically, a commonly used phase-change material is GeSbTe which is a compound of germanium (Ge), antimony (Sb), and tellurium (Te).

Row decoder 150 decodes received address information and designates a row of the memory cell array 100 based on the decoding result.

First circuit block 400 performs a first operation on memory cells in memory cell array 100. For example, the first operation may be a write operation. Specifically, first circuit block 400 may include a column decoder CDEC that designates columns of the memory cell array 100, and a write driver PGMDRV that supplies a write current to memory cells designated by row decoder 150 and the column decoder CDEC, and writes data to the designated memory cells.

Second circuit block 300 performs a second operation on memory cells in memory cell array 100. For example, the second operation may be a read operation. Specifically, second circuit block 300 may include a column decoder CDEC that designates columns of memory cell array 100, and a sense amplifier SA that supplies a read current to memory cells designated by the column decoder CDEC and reads data from the designated memory cells.

First circuit block 400 and second circuit block 300 may be arranged to be separated from each other. As shown in FIG. 2, first circuit block 400 may be disposed at one side, e.g., the right side, of memory cell array 100, and second circuit block 300 may be disposed at the other side, e.g., the left side, of the memory cell array 100.

Redundancy block 200 may include a ROM (Read Only Memory) that stores information regarding a repaired memory cell in normal memory array 110 (for example, the address of the repaired memory cell, which is to be referred to a "repair address" hereinafter). The ROM may be, for example, a fuse.

Figure 3:
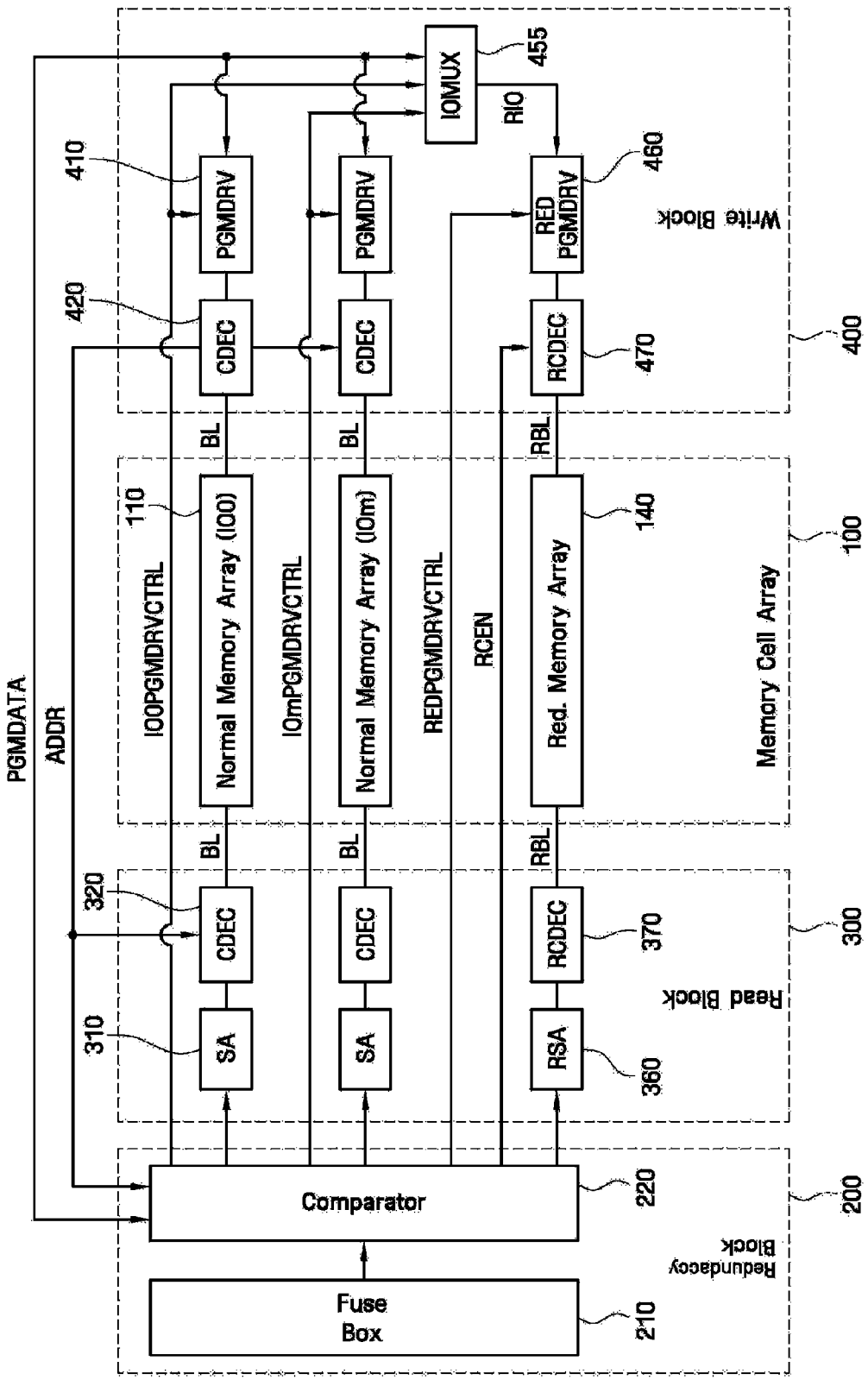
FIG. 3 is an intermediate level block diagram illustrating an example of an embodiment of a nonvolatile memory device according to one or more aspects of the present inventive concept.

FIG. 3 is an intermediate level block diagram illustrating an example of an embodiment of a nonvolatile memory device according to one or more aspects of the present inventive concept. FIG. 3 is a more detailed block diagram of a portion of FIG. 2.

Referring to FIG. 3, memory cell array 100 may include a plurality of normal memory arrays 110 and at least one redundancy memory array 140. Here, the plurality of normal memory arrays 110 may correspond to input/output pins IO0-IOm, respectively. The normal memory array 110 corresponding to, for example, IO0, may receive data through the IO pin IO0.

Redundancy block 200 may include a fuse box 210 and a comparator 220.

Second circuit block 300 may include a sense amplifier (SA) 310, a read address decoder (RD ADDR DEC) 320, a redundancy sense amplifier (RSA) 360, and a redundancy read address decoder (RCDEC) 370. SA 310 and read address decoder 320 are circuit blocks for reading data from memory cells of normal memory array 110. Read address decoder 320 decodes the input address ADDR and designates a memory cell to be read, and SA 310 reads data from the designated memory cell. RSA 360 and RCDEC 370 are circuit blocks for reading data from redundancy memory cells of redundancy memory array 140. RCDEC 370 decodes the input address ADDR and designates the redundancy memory cell to be read, and RSA 360 reads data from the designated redundancy memory cell. SA 310 and RSA 360 may be enabled/disabled by a control signal output from the comparator 220.

First circuit block 400 may include one or more write drivers 410, one or more write address decoders (CDECs) 420, an input/output multiplexer (IOMUX) 455, a redundancy write driver 460, and a redundancy write address decoder 470. Write driver 410 and write address decoder 420 are circuit blocks for performing a write operation on memory cells of the normal memory array 110. Write address decoder 420 decodes the input address ADDR and designates a memory cell to be written, and write driver 410 supplies a write current corresponding to write data PGMDATA to the memory cell to be written. As described below, write driver 410 may be disabled by the first control signals IO0PGMDRVCTRL-IOmPGMDRVCTRL. IOMUX 455, redundancy write driver 460, and redundancy write address decoder 470 are circuit blocks for performing a write operation for redundancy memory cells of redundancy memory array 140.

Operationally, fuse box 210 of redundancy block 200 may store the repair address of a repaired memory cell among plurality of memory cells of memory cell array 100. The repair address may include IO information, that is, information on which IO pin data is transferred through, column address information, row address information, and so on.

Comparator 220 compares the repair address supplied from fuse box 210 against an input address ADDR, and in response thereto generates redundancy control signals IO0PGMDRVCTRL-IOmPGMDRVCTRL, RCEN, and REDPGMDRVCTRL. In detail, the redundancy control signals IO0PGMDRVCTRL-IOmPGMDRVCTRL, RCEN, and REDPGMDRVCTRL may include first control signals IO0PGMDRVCTRL-IOmPGMDRVCTRL, a second control signal RCEN, and a third control signal REDPGMDRVCTRL.

The first control signals IO0PGMDRVCTRL-IOmPGMDRVCTRL may be generated by comparing IO information included in the repair address with IO information included in the input address ADDR. The first control signals IO0PGMDRVCTRL-IOmPGMDRVCTRL may include a plurality of component signals and may be used to disable at least one of the plurality of write drivers 410 of first circuit block 400.

The second control signal RCEN may be generated using the column address information included in the repair address. The second control signal RCEN may include a plurality of component signals and may be supplied to redundancy write address decoder 470.

The third control signal REDPGMDRVCTRL may be generated by comparing column address information included in the repair address with column address information included in the input address ADDR. The third control signal REDPGMDRVCTRL may be used to enable at least one redundancy write driver 460 of the first circuit block 400.

IOMUX 455 receives a plurality of write data PGMDATA, selects some of the plurality of write data PGMDATA according to the first control signals IO0PGMDRVCTRL-IOmPGMDRVCTRL, and supplies the selected write data to redundancy write driver 460. For example, when a first control signal IO0PGMDRVCTRL among m first control signals IO0PGMDRVCTRL-IOmPGMDRVCTRL is enabled, the IOMUX 455 may select some data RIO among the plurality of write data PGMDATA corresponding to the enabled signal IO0PGMDRVCTRL.

Redundancy write address decoder 470 decodes the second control signal RCEN and designates a redundancy memory cell to be written. Redundancy write driver 460 supplies to the redundancy memory cell to which data is to be written, a write current corresponding to the selected write data RIO. As described above, redundancy write driver 460 may be enabled by the third control signal REDPGMDRVCTRL.

Figure 4:
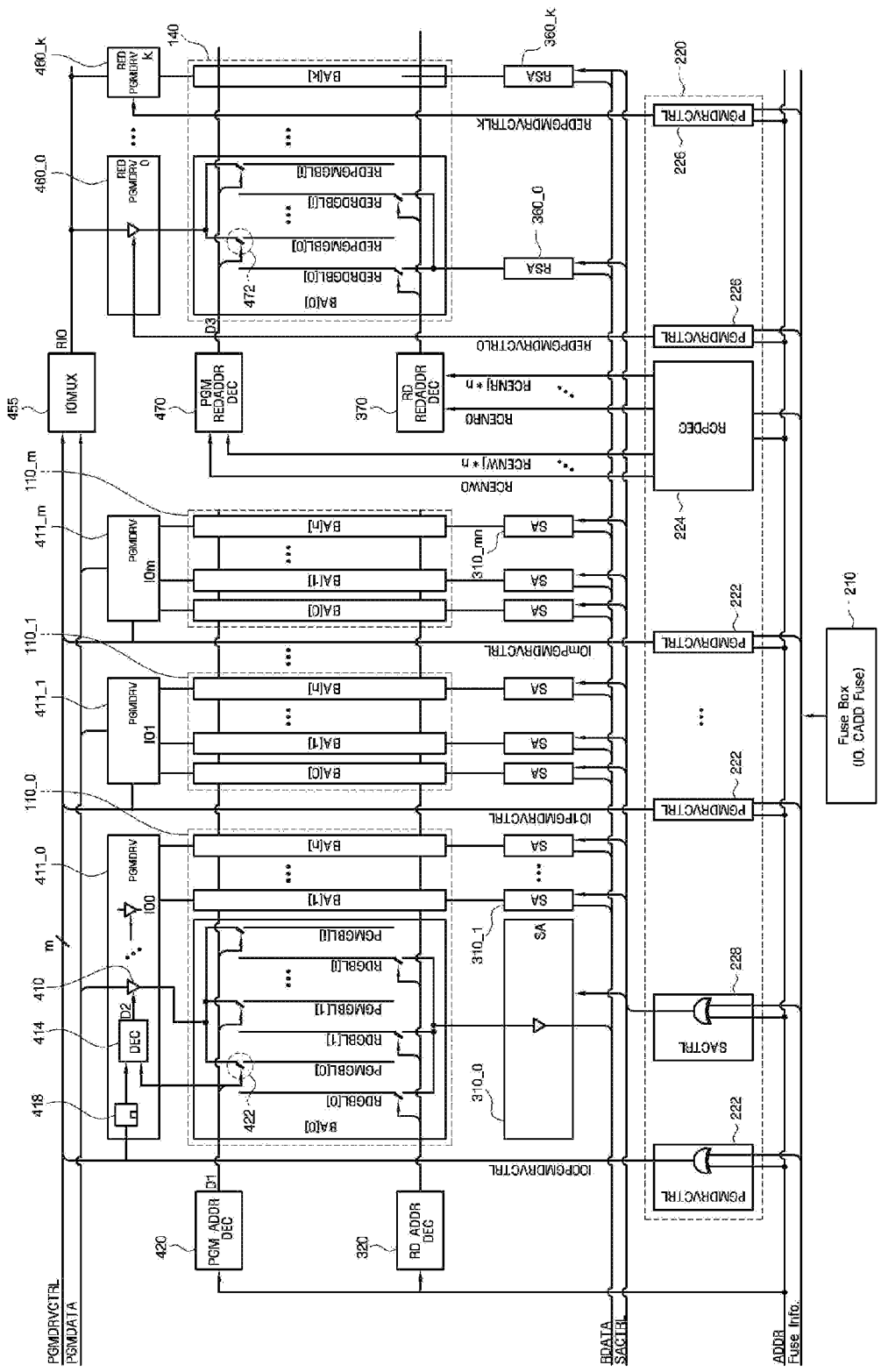
FIG. 4 is a detailed level block diagram illustrating an example of an embodiment of a nonvolatile memory device according to one or more aspects of the present inventive concept.

FIG. 4 is a detailed level block diagram illustrating an example of an embodiment of a nonvolatile memory device according to one or more aspects of the present inventive concept. FIG. 4 is a more detailed block diagram of FIG. 3.

Referring to FIG. 4, the plurality of normal memory arrays 110_0-110_m may be arranged to correspond to IO blocks 410_0-410_m, respectively. In addition, each of the plurality of normal memory arrays 110 may include a plurality of memory blocks BA(0)-BA(n) where n is a natural number.

Redundancy memory array 140 may also include a plurality of memory blocks BA(0)-BA(n).

Each of the memory blocks BA(0)-BA(n) may include a plurality of memory cells and may have a hierarchical bit line structure. That is to say, the bit line structure may include a global bit line arranged across the memory blocks BA(0)-BA(n), and a plurality of local bit lines coupled to the global bit line.

In addition, the illustrated nonvolatile memory device may also include write global bit lines PGMGBL(0)-GMGBL(i), where i is a natural number, used in a write operation, and read global bit lines RDGBL(0)-RDGBL(i) used in a read operation. Further, although not clearly shown, the local bit lines may be selectively coupled to write global bit lines PGMGBL(0)-PGMGBL(i) and read global bit lines RDGBL(0)-RDGBL(i), and the plurality of memory cells may be coupled to the local bit lines. An example of the hierarchical bit line structure is disclosed in U.S. Patent Application Publication 2008/0158941, the contents of which are hereby incorporated herein by reference in their entirety.

As shown in FIG. 1, memory cell array 100 may be arranged in a stack arrangement. Therefore, the memory cell array 100 may be divided into a plurality of partitions, and the plurality of partitions may be arranged in a stack arrangement. Here, the partitions are independent units capable of simultaneously performing write operation/read operation.

Redundancy block (e.g., shown in FIG. 3 as element 200) may include fuse box 210 and comparator 220.

Fuse box 210 may include an input/output fuse (IO Fuse), and an address fuse (ADD Fuse), specifically a column address fuse. The IO Fuse may store IO information of the repair address, and the ADD Fuse may store address information of the repair address.

Comparator 220 may include one or more first comparators 222, one or more second comparators 224, one or more third comparators 226, and a fourth comparator 228.

First comparator(s) 222 may compare the IO information included in the repair address with the IO information included in the input address and in response to the comparison generate a plurality of first control signals IO0PGMDRVCTRL-IOmPGMDRVCTRL. The numbers of the plurality of first control signals IO0PGMDRVCTRL-IOmPGMDRVCTRL and the plurality of IO blocks 410_0-410_m may be equal to each other, and the first control signals IO0PGMDRVCTRL-IOmPGMDRVCTRL may be input to the corresponding IO blocks 410_0-410_m, respectively.

Second comparator(s) 224 may generate second control signals RCENW0-RCENWj*n, and RCENR0-RCENRj*n using the column address information included in the repair address. The second control signal RCEN may include signals RCENW0-RCENWj*n used in a write operation, and signals RCENR0-RCENRj*n used in a read operation. The signals RCENW0-RCENWj*n are input to write redundancy address decoder 470 to then be decoded, and the signals RCENR0-RCENRj*n are input to read redundancy address decoder 370 to then be decoded.

Third comparator(s) 226 may compare the column address information included in the repair address with the column address information included in the input address and generate a plurality of third control signals REDPGMDRVCTRL0-REDPGMDRVCTRLk. The third control signals REDPGMDRVCTRL0-REDPGMDRVCTRLk enable redundancy write drivers 460_0-460_k.

Fourth comparator 228 generates a fourth control signal SACTRL using the repair address and the input address, and controls sense AMPs 310_0-310_mn and redundancy sense AMPs 360_0-360_k.

The first circuit block (e.g., shown in FIG. 3 as element 400) may include a plurality of IO blocks 411_0-411_m, write address decoder 420, IO MUX 455, a plurality of redundancy write drivers 460_0-460_k, and redundancy write address decoder 470.

First circuit block 400 may include the plurality of IO blocks 411_0-411_m, where m is a natural number. Respective IO blocks 411_0-410_m may receive data through the corresponding IO pins. For example, an IO block 411_0 may correspond to an IO pin 100, and an IO block 411_1 may correspond to an IO pin 101, an IO block 411_m may correspond to an IO pin IOm, etc.

Write address decoder 420 decodes the input address ADDR and outputs a first decoding signal D1. A write global bit line, e.g., PGMGBL(0), is selected by the first decoding signal D1. That is to say, a write global bit line selection circuit 422 is controlled in response to the first decoding signal D1. Write driver 410 supplies a write current to memory cells through the selected write global bit line PGMGBL(0) memory cells.

In the illustrated embodiment of FIG. 4, write driver 410 coupled to the repaired memory cell is disabled by the first control signals IO0PGMDRVCTRL-IOmPGMDRVCTRL.

The first control signals IO0PGMDRVCTRL-IOmPGM-DRVCTRL output from first comparator 222 may be either completely decoded signals or partially decoded signals.

When the first control signals IO0PGMDRVCTRL-IOmPGMDRVCTRL are completely decoded signals, additional decoding may not need to be separately performed in IO blocks 410_0-410_m. That is to say, among the plurality of write drivers disposed in IO blocks 410_0-410_m, only the write drivers coupled to the repaired memory cell receive the first control signals IO0PGMDRVCTRL-IOmPGMDRVC-TRL to then be disabled.

However, when the first control signals IO0PGMDRVCTRL-IOmPGMDRVCTRL are partially decoded signals, additional decoding needs to be performed in IO blocks 410_0-410_m. As shown, each of the IO blocks 410_0-410_m may include a latch 418 that stores the first control signal (e.g., IO0PGMDRVCTRL), and a decoder 414 that receives and decodes the first control signal IO0PGMDRVCTRL stored in latch 418 and the first decoding signal D1 and outputs a second decoding signal D2. The write driver 410 coupled to the repaired memory cell may receive the second decoding signal D2 to then be disabled.

IO MUX 455 may receive the plurality of write data PGM-DATA, select some of the plurality of write data PGMDATA according to the plurality of first control signals IO0PGMDRVCTRL-IOmPGMDRVCTRL and supply the selected write data to redundancy write drivers 460_0-460_k. For example, when one signal IO0PGMDRVCTRL among (m+1) first control signals IO0PGMDRVCTRL-IOmPGMDRVCTRL is enabled, IO MUX 455 may select some data RIO of the plurality of write data PGMDATA corresponding to the one enabled signal IO0PGMDRVCTRL.

Redundancy write address decoder 470 decodes the plurality of second control signals RCEN and outputs a third decoding signal D3. A redundancy write global bit line, e.g., REDPGMGBL(0), is selected by the third decoding signal D3. That is to say, redundancy write global bit line selection circuit 472 is controlled in response to the third decoding signal D3. Redundancy write driver 460_0 receives the third control signal REDPGMDRVCTRL to then be enabled, and writes the selected data RIO to the redundancy cell corresponding to the repaired memory cell through the selected redundancy write global bit line REDPGMGBL(0).

Second circuit block 300 may include sense amplifiers (AMPs) (SAs) 310_0-310_mn, a read address decoder (CDEC) 320, redundancy sense amplifiers (AMPs) (RSAs) 360_0-360_k, and redundancy read address decoder (RC-DEC) 370.

Read address decoder 320 decodes an input address ADDR and selects a read global bit line, e.g., RDGBL(0). For example, sense AMP 310_0 supplies a read current to memory cells through the selected read global bit line RDGBL(0) and reads the memory cells.

RCDEC 370 decodes the second control signals RCEN and a redundancy read global bit line, e.g., REDRDGBL(0), is selected. Redundancy sense AMPs, e.g., 360_0, supplies a read current to redundancy memory cells through the selected redundancy read global bit line REDRDGBL(0).

Meanwhile, redundancy block 200 is closer to second circuit block 300 and is further from first circuit block 400. Therefore, the redundancy block 200 is required to transfer redundancy control signals IO0PGMDRVCTRL-IOmPGM-DRVCTRL, RCEN, REDPGMDRVCTRL associated with redundancy to first circuit block 400. In this regard, however, if there are a large number of signals associated with redundancy, an array of signal wires may become complicated and the layout thereof may become complicated, and a layout area become increased.

However, redundancy block 200 decodes the repair address, instead of transferring the repair address to first circuit block 400, and transfers the first control signals IO0PGMDRVCTRL-IOmPGMDRVCTRL), the second control signals RCENW0-RCENWj*n), and third control signals REDPGMDRVCTRL0-REDPGMDRVCTRLk to first circuit block 400. Accordingly, the number of signals to be transmitted to the first circuit block 400 may be reduced.

The number of signals to be transmitted is as follows:
First control signals IO0PGMDRVCTRL-IOmPGM-DRVCTRL: m+1;
Second control signals RCENW0-RCENWj*n: j*n+1; and
Third control signals REDPGMDRVCTRL0-REDPGM-DRVCTRLk: k+1.

Therefore, a total number of signals to be transmitted to the first circuit block 400 is (m+1)+(en+1)+(k+1).

In addition, redundancy block 200 may transmit the redundancy control signals IO0PGMDRVCTRL-IOmPGM-DRVCTRL, RCEN, and REDPGMDRVCTRL, specifically, the first control signals IO0PGMDRVCTRL-IOmPGM-DRVCTRL to first circuit block 400 before the write operation is started. The first control signals IO0PGMDRVCTRL-IOmPGMDRVCTRL are stored in latch 418 of first circuit block 400. Therefore, first circuit block 400 can easily use the first control signals IO0PGMDRVCTRL-IOmPGMDRVC-TRL stored in latch 418 if necessary.

Figure 5:
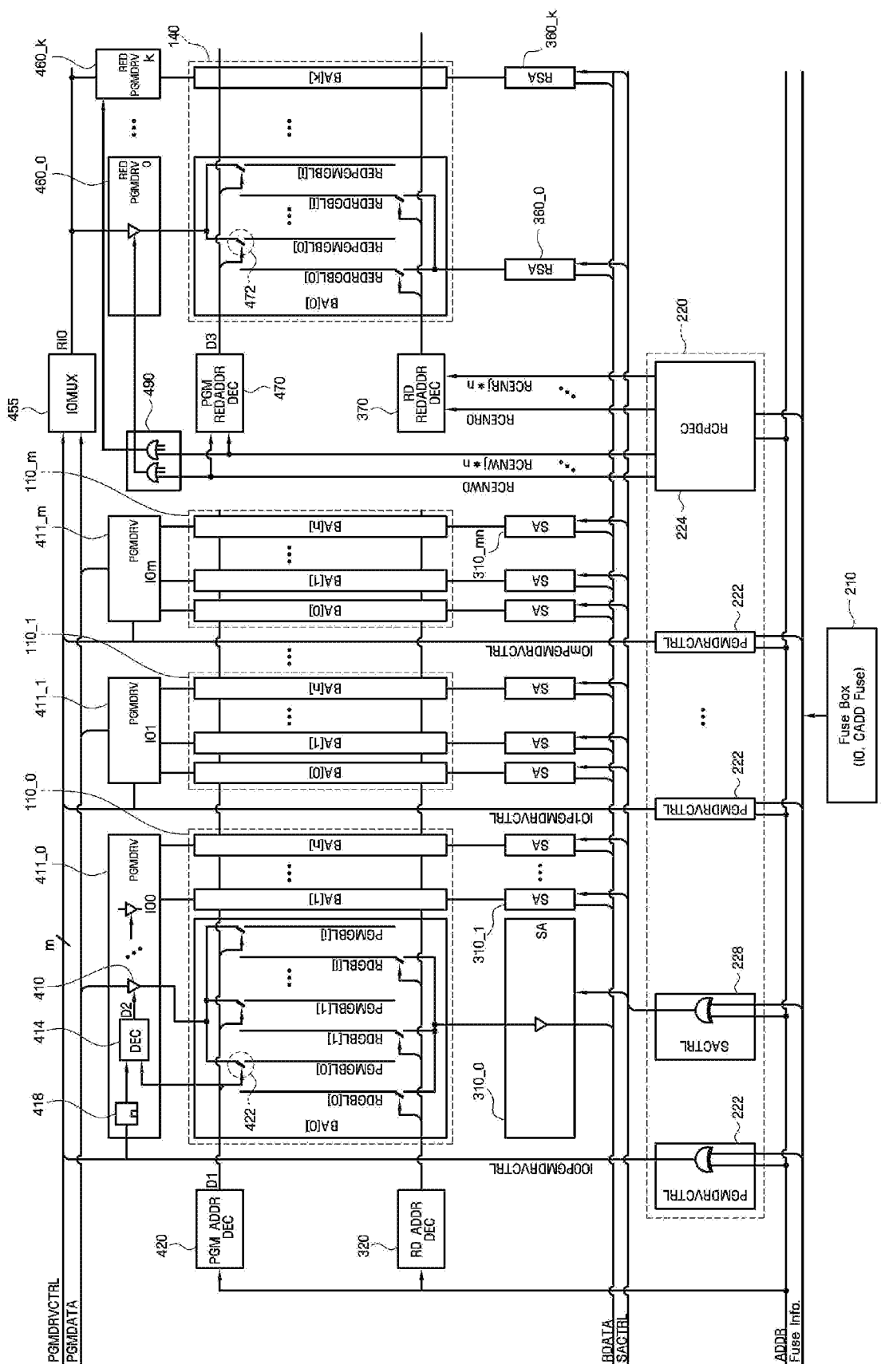
FIG. 5 is a detailed level block diagram illustrating an example of another embodiment of a nonvolatile memory device according to other aspects of the present inventive concept.

FIG. 5 is a detailed level block diagram illustrating an example of another embodiment of a nonvolatile memory device according to other aspects of the present inventive concept. For brevity, in the following description, the nonvolatile memory device of FIG. 5 will be described with emphasis on differences between what is illustrated in FIG. 5 and what is illustrated in FIG. 4 and has been described above.

Referring to FIG. 5, the redundancy block 200 does not include third comparator(s) 226 that generate the third control signal REDPGMDRVCTRL in FIG. 4.

Operation unit 490 included in the first circuit block 400 generates a third control signal REDPGMDRVCTRL using at least some of the plurality of second control signals RCEN.

In detail, operation unit 490 may include an OR operator. For example, operation unit 490 may include an OR operator that receives signals RECNW0-RECNWi. If any one of the signals RECNW0-RECNWi is enabled, the OR operator may enable the second control signal REDPGMDRVCTRL0.

With this configuration, since it is not necessary to transmit the third control signal REDPGMDRVCTRL to first circuit block 400 from redundancy block 200, the number of signals to be transmitted to first circuit block 400 may be reduced.

In the embodiment of FIG. 5, the number of signals to be transmitted is as follows.
First control signals IO0PGMDRVCTRL-IOmPGM-DRVCTRL): m+1; and
Second control signals RCENW0-RCENWj*n: j*n+1.

Therefore, a total number of signals to be transmitted to the first circuit block 400 is (m+1)+(j*n+1).

FIGS. 6 through 18, and the accompanying descriptions which follow, illustrate various systems which may include a nonvolatile memory device according to one or more embodiments of the present inventive concept.

Figure 6:
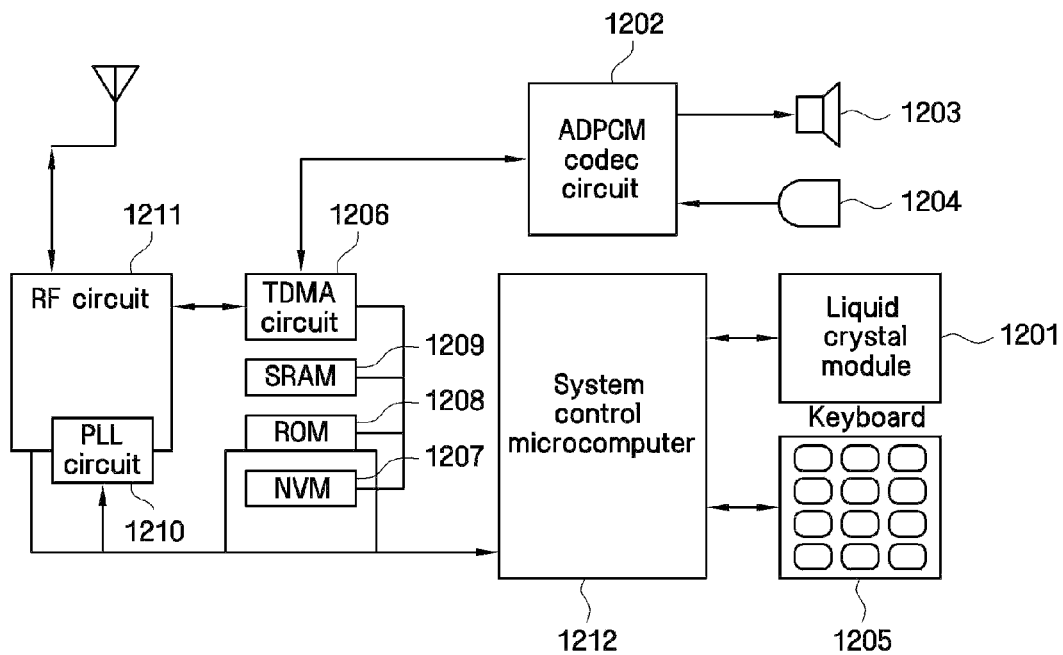
FIG. 6 illustrates an example of an embodiment of a cell phone system which may include a nonvolatile memory device according to one or more embodiments of the present inventive concept.

FIG. 6 illustrates an example of an embodiment of a cell phone system which may include a nonvolatile memory device according to one or more embodiments of the present inventive concept.

Referring to FIG. 6, the cellular phone system may include a compression or decompression ADPCM codec circuit 1202 which compresses sound or decompresses compressed sound, a speaker 1203, a microphone 1204, a time division multiplex access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal In addition, the cellular phone system may include various types of memory devices. For example, the cellular phone system may include a nonvolatile memory device 1207, a read only memory (ROM) 1208, and a static random access memory (SRAM) 1209. Nonvolatile memory device 1207 may be any one of the nonvolatile memory devices according to the embodiments of the present inventive concept and may store, for example, an identification (ID) number. ROM 1208 may store programs, and SRAM 1209 may serve as a work area for a system control microcomputer 1212, or may temporarily store data. System control microcomputer 1212 is a processor and may control a write operation and a read operation of nonvolatile memory device 1207.

Figure 7:
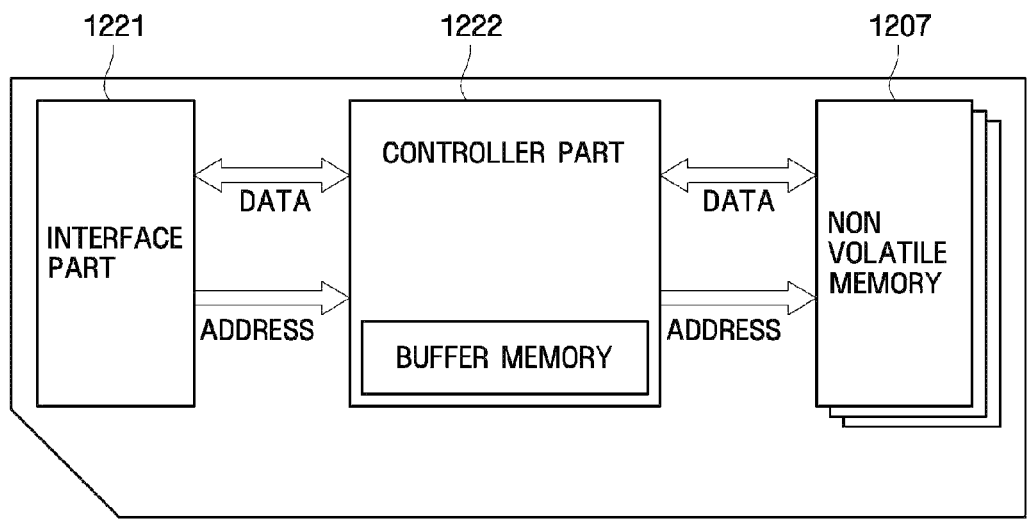
FIG. 7 illustrates an example of an embodiment of a memory card which may include a nonvolatile memory device according to one or more embodiments of the present inventive concept.

FIG. 7 illustrates an example of an embodiment of a memory card which may include a nonvolatile memory device according to one or more embodiments of the present inventive concept.

The memory card, for example, may be an MMC card, an SD card, a multiuse card, a micro-SD card, a memory stick, a compact SD card, an ID card, a PCMCIA card, an SSD card, a chip-card, a smartcard, a USB card, or the like.

Referring to FIG. 7, the memory card may include an interface circuit 1221 for interfacing with an external device, a controller 1222 (including a buffer memory) for controlling an operation of the memory card, and at least one non-volatile memory device 1207 according to embodiments of the present inventive concept. Controller 1222 may be a processor which is configured to control write and read operations of non-volatile memory device 1207. In particular, controller 1222 may be coupled with non-volatile memory device 1207 and the interface circuit 1221 via a data bus DATA and an address bus ADDRESS.

Figure 8:
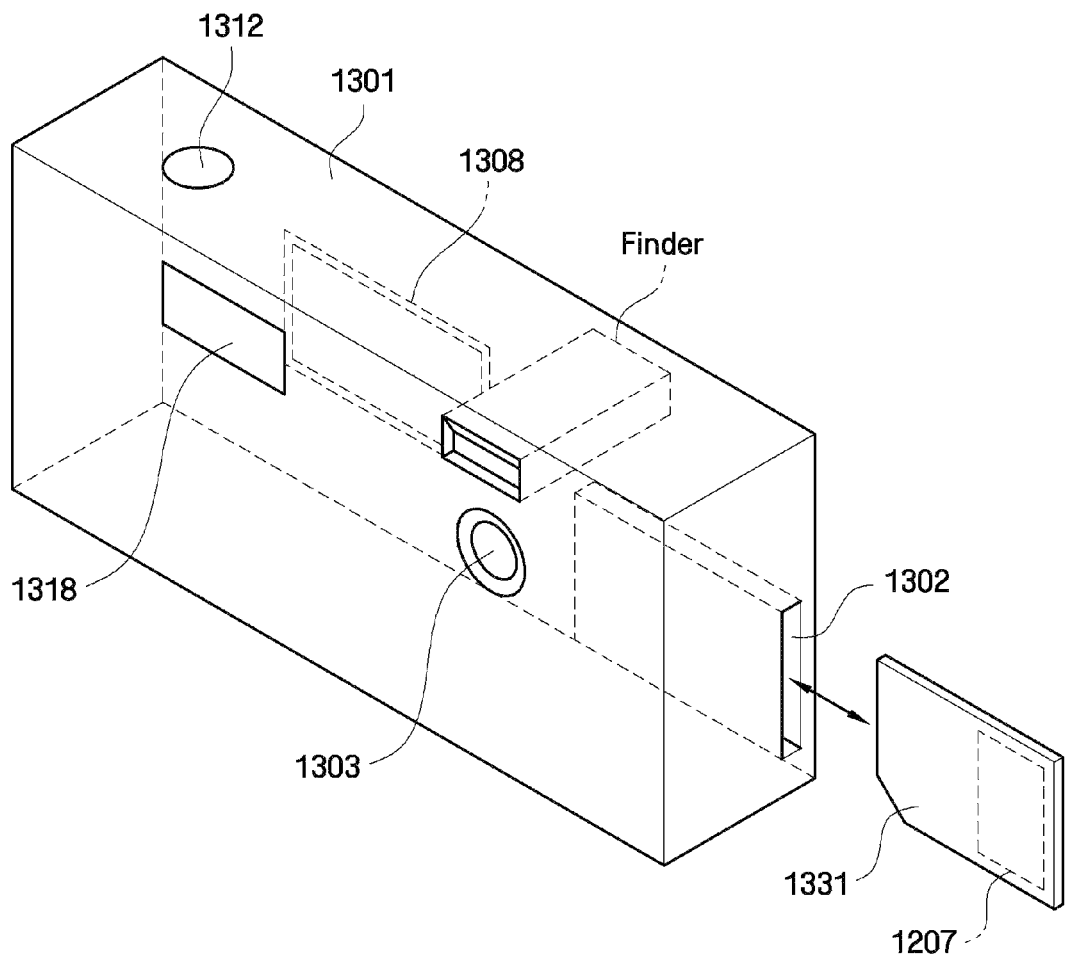
FIG. 8 illustrates an example of an embodiment of a digital camera which may include a nonvolatile memory device according to one or more embodiments of the present inventive concept.

FIG. 8 illustrates an example of an embodiment of a digital camera which may include a nonvolatile memory device according to one or more embodiments of the present inventive concept.

Referring to FIG. 8, a digital still camera may include a body 1301, a slot 1302, a lens 1303, a display circuit 1308, a shutter button 1312, a strobe 1318, and the like. In particular, a memory card 1331 may be inserted in the slot 1308 and include at least one non-volatile memory device according to embodiments of the present inventive concept.

If the memory card 1331 is a contact type, an electric circuit on a circuit board may be electrically contacted with the memory card 1331 when it is inserted in the slot 1308. If the memory card 1331 is a non-contact type, an electric circuit on a circuit board may communicate with the memory card 1331 in a radio-frequency manner.

Figure 9:
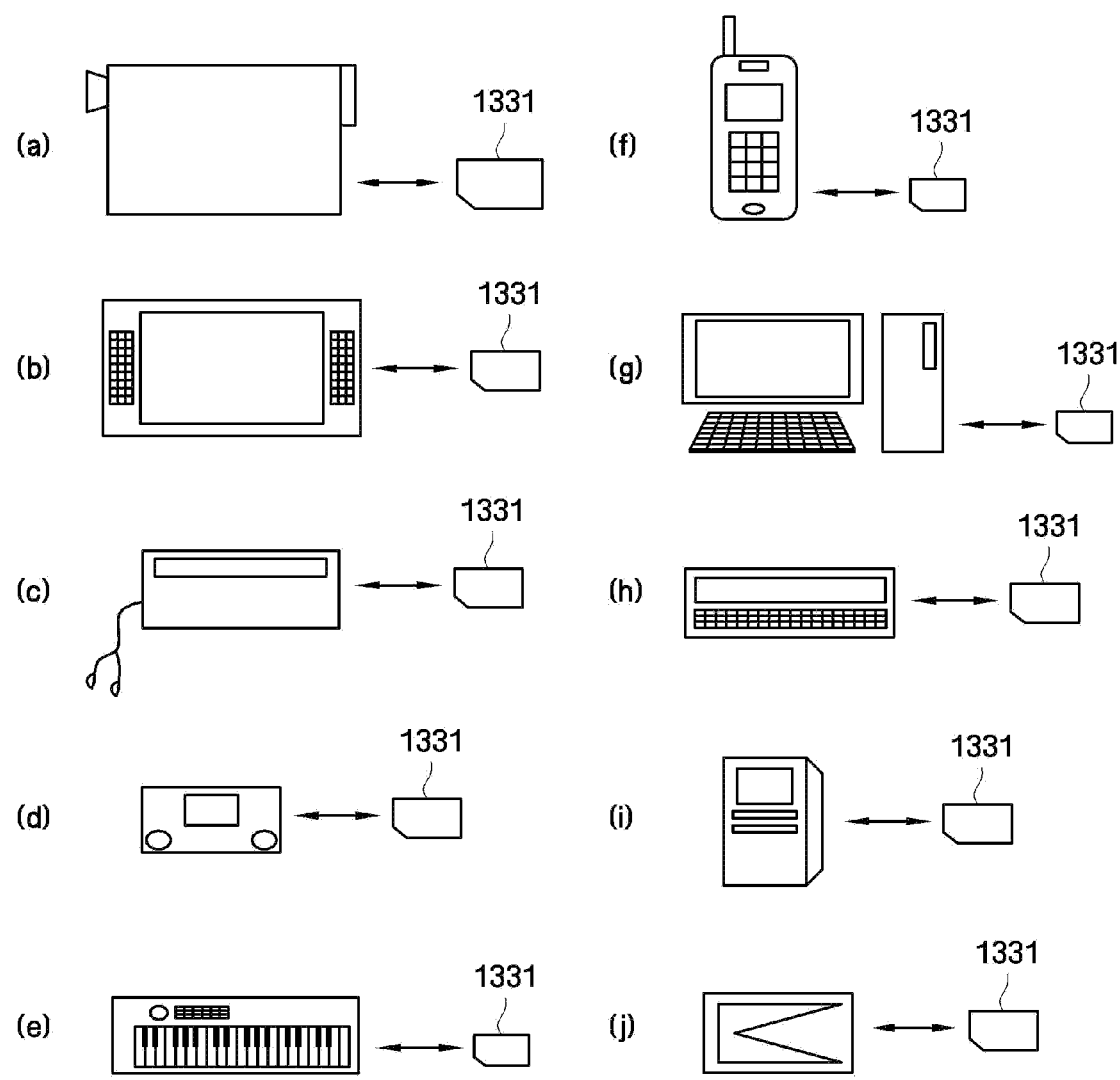
FIG. 9 illustrates examples of an embodiment of various devices or systems which may include a nonvolatile memory device according to one or more embodiments of the present inventive concept.

FIG. 9 illustrates examples of an embodiment of various devices or systems which may include a nonvolatile memory device according to one or more embodiments of the present inventive concept.

Referring to FIG. 9, the memory card 1331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 10:
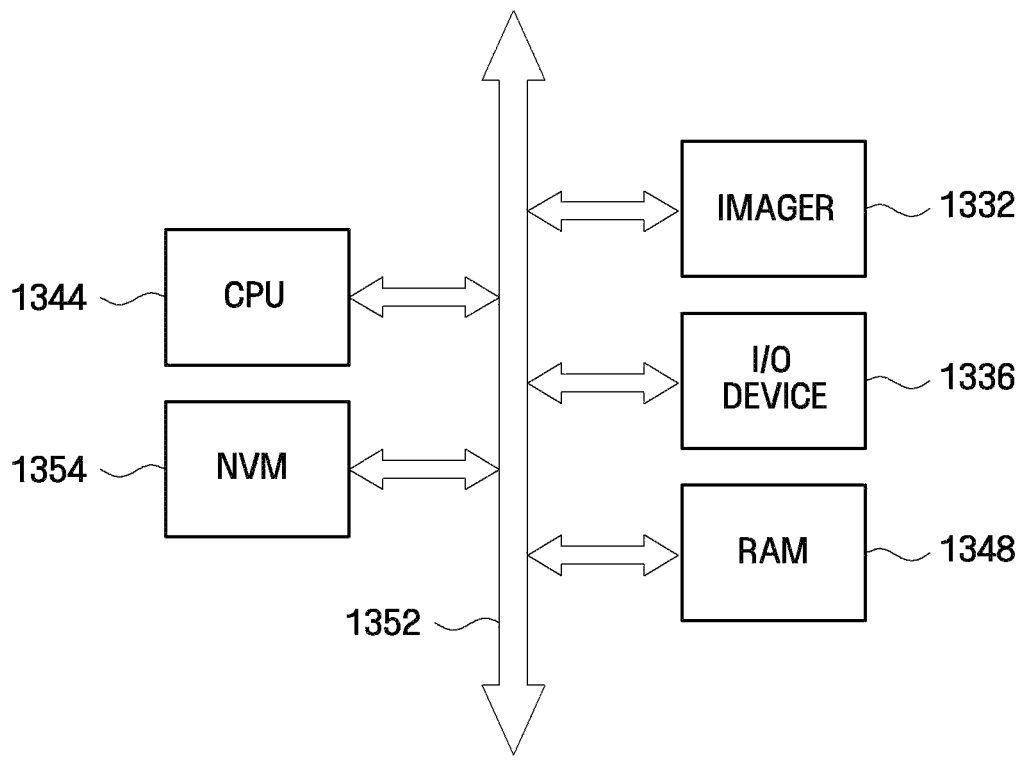
FIG. 10 illustrates an example of an embodiment of an image sensor system which may include a nonvolatile memory device according to one or more embodiments of the present inventive concept.

FIG. 10 illustrates an example of an embodiment of an image sensor system which may include a nonvolatile memory device according to one or more embodiments of the present inventive concept.

Referring to FIG. 10, the image sensor system may include an image sensor 1332, an input/output device 1336, RAM 1348, CPU 1344, and a non-volatile memory device 1354 according to embodiments of the present inventive concept. Elements in FIG. 10 may communicate with one another via a bus 1352. The image sensor 1332 may include a photo sensing device such as a photo-gate, photo-diode, or the like. Elements in FIG. 10 may be formed on a single chip together with a processor, or independently from the processor.

Figure 11:
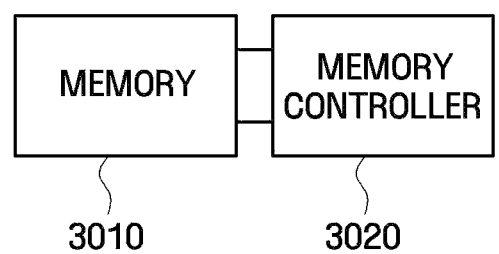
FIG. 11 illustrates an example of an embodiment of a memory system which may include a nonvolatile memory device according to one or more embodiments of the present inventive concept.

FIG. 11 illustrates an example of an embodiment of a memory system which may include a nonvolatile memory device according to one or more embodiments of the present inventive concept.

As shown in FIG. 11, a memory 3010 is coupled to a memory controller 3020. Memory 3010 may be any of the memory devices of the embodiments described above. Memory controller 3020 supplies the input signals for controlling an operation of memory 3010. For example, memory controller 3020 supplies the command CMD and address signals. Memory controller 3020 may include a memory interface, a host interface, an error detection/correction (ECC) circuit, a central processing unit (CPU), and a buffer memory. The memory interface may provide data transmitted from the buffer memory to memory 3010, or transmit data read out of memory 3010 to the buffer memory. In addition, the memory interface may provide a command or an address transmitted from an external host to memory 3010.

The host interface may communicate with an external host through USB (Universal Serial Bus), SCSI (Small Computer System Interface), PCI express, ATA, PATA (Parallel ATA), SATA (Serial ATA), SAS (Serial Attached SCSI).

A memory system according to embodiments of the present inventive concept may further include an ECC circuit, which generates a parity bit using data transmitted to a memory 3010. The generated parity bit may be stored in a specific area of memory 3010, together with data. The ECC circuit detects an error of data read out of memory 3010. If the detected error is within a correction range, the ECC circuit corrects the detected error.

The CPU processes a signal input from the external host after analyzing the input signal. The CPU controls the external host or memory 3010 through the host interface or the memory interface. The CPU may control write, read, and erase operations depending on firmware for driving a memory.

The buffer memory temporarily stores write data provided from the external host or data read out of memory 3010. In addition, the buffer memory may store meta data or cache data stored in memory 3010. During a sudden power-off operation, meta data or cache data stored in the buffer memory may be stored in the memory 3010. The buffer memory may include a DRAM and an SRAM.

Figure 12:
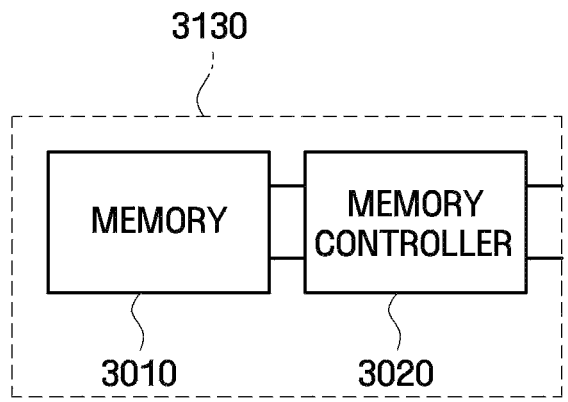
FIG. 12 illustrates another example of an embodiment of a memory system which may include a nonvolatile memory device according to one or more embodiments of the present inventive concept.

FIG. 12 illustrates another example of an embodiment of a memory system which may include a nonvolatile memory device according to one or more embodiments of the present inventive concept.

The embodiment of FIG. 12 is the same as the embodiment of FIG. 11, except that memory 3010 and memory controller 3020 have been embodied as a card 3130. For example, card 3130 may be a memory card such as a flash memory card. That is to say, card 3130 may be a card satisfying any industry standard for use with a consumer electronics device such as a digital camera, personal computer, etc. Memory controller 3020 may control the memory 3010 based on controls signals received by card 3130 from another device (e.g., external device).

Figure 13:
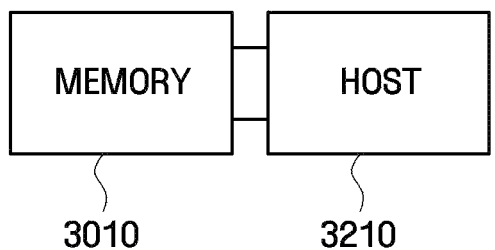
FIG. 13 illustrates yet another example of an embodiment of a memory system which may include a nonvolatile memory device according to one or more embodiments of the present inventive concept.

FIG. 13 illustrates yet another example of an embodiment of a memory system which may include a nonvolatile memory device according to one or more embodiments of the present inventive concept.

As shown in FIG. 13, memory 3010 may be coupled to a host system 3210. Host system 3210 may be a processing system such as a personal computer, digital camera, etc. Host system 3210 may use memory 3010 as a removable storage medium. Host system 3210 may supply input signals for controlling operations of memory 3010. For example, host system 3210 may supply the command (CMD) and address (ADDR) signals.

Figure 14:
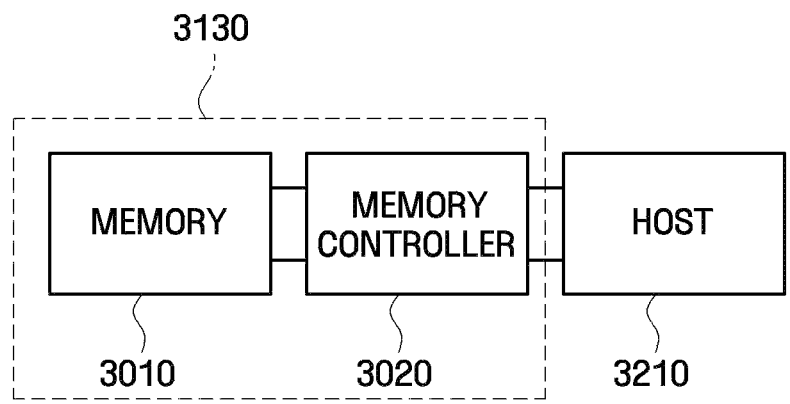
FIG. 14 illustrates still another example of an embodiment of a memory system which may include a nonvolatile memory device according to one or more embodiments of the present inventive concept.

FIG. 14 illustrates still another example of an embodiment of a memory system which may include a nonvolatile memory device according to one or more embodiments of the present inventive concept.

Referring to FIG. 14, host system 3210 is coupled to card 3130. Host system 3210 supplies a control signal to card 3130 to allow memory controller 3020 to control memory 3010.

Figure 15:
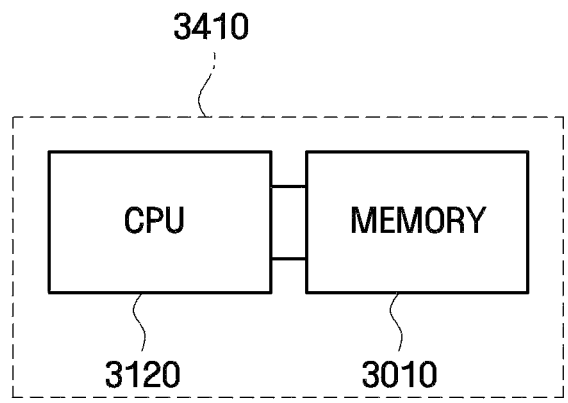
FIG. 15 illustrates a further example of an embodiment of a memory system which may include a nonvolatile memory device according to one or more embodiments of the present inventive concept.

FIG. 15 illustrates a further example of an embodiment of a memory system which may include a nonvolatile memory device according to one or more embodiments of the present inventive concept.

Referring to FIG. 15, a memory 3010 may be stored in a central processing unit (CPU) 3120 within a computer system 3410. For example, computer system 3410 may be a personal computer, personal data assistant (PDA), etc. Memory 3010 may be directly connected with CPU 3120 via a bus, etc.

A nonvolatile memory device according to embodiments of the present inventive concept may be used as a storage class memory (SCM), which is the general concept of memories capable of simultaneously providing nonvolatile characteristics and access characteristics. The SCM may be utilized as not only a data storage space but also a program performing space.

The above-described PRAM, FRAM, and MRAM are selected examples of a broad class of data storage devices. Such data storage devices may be used not only as general data storage units but as replacements for conventional flash memory main memory applications such as SRAM, etc. The SCM may be used as a data storage memory instead of flash memory. The SCM may also be used as a main memory system instead of an SDRAM. An SCM may replace an SDRAM as well as flash memory.

Figure 16:
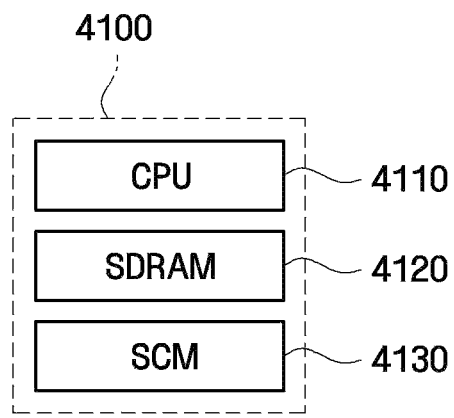
FIG. 16 illustrates an example of an embodiment of a memory system which includes a storage class memory (SCM).

FIG. 16 illustrates an example of an embodiment of a memory system 4100 which includes a storage class memory (SCM).

Memory system 4100 includes a CPU 4110, an SDRAM 4120, and an SCM 4130 used instead of flash memory.

In memory system 4100, data access speed of the SCM 4130 is greater than that of a flash memory. For example, under a PC environment where the CPU 4110 runs at 4 GHz, data access speed of a PRAM which is one embodiment of SCM 4130 may be about 32 times greater than that of a flash memory. Thus, memory system 4100 equipped with the SCM 4130 may attain a faster access speed than a memory system equipped with a flash memory.

Figure 17:
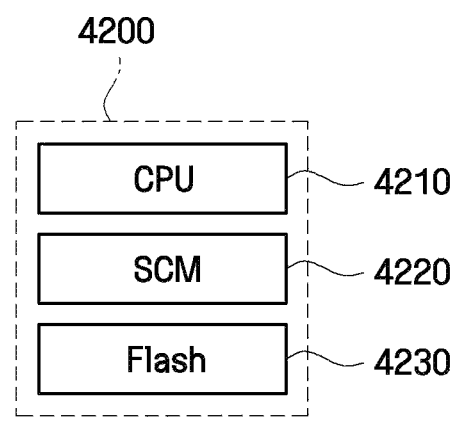
FIG. 17 illustrates another example of an embodiment of a memory system which includes an SCM.

FIG. 17 illustrates another example of an embodiment of a memory system 4200 which includes an SCM.

Memory system 4200 includes a CPU 4210, an SCM 4220 used instead of SDRAM, and a flash memory 4230.

In the memory system 4200, power dissipation of SCM 4220 may be less than that of an SDRAM. Energy dissipation for a main memory in a computer system can account for up to 40% of total energy use. Therefore, significant efforts have been made to reduce the required amount of energy dissipation from main memories. Incorporation of an SCM may reduce energy dissipation on average about 53%, and reduce energy dissipation caused by power leakage on average about 73%. As a result, memory system 4200 equipped with the SCM 4220 may allow power dissipation to be reduced compared to a memory system equipped with an SDRAM.

Figure 18:
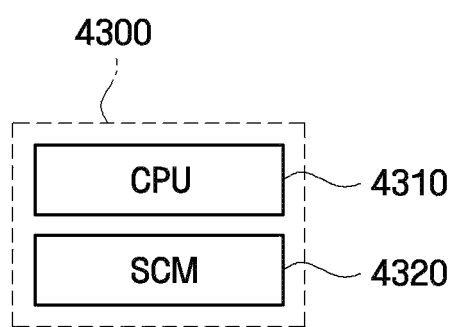
FIG. 18 illustrates yet another example of an embodiment of a memory system which includes an SCM.

FIG. 18 illustrates yet another example of an embodiment of a memory system 4300 which includes an SCM.

Memory system 4300 includes a CPU 4310 and an SCM 4320 used instead of SDRAM and flash memory. SCM 4320 is used as a main memory instead of an SDRAM and as a data storage memory instead of a flash memory. Memory system 4300 may be advantageous in data access speed, low power, space utilization, and costs.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A nonvolatile memory device, comprising:
   a memory cell array having a plurality of memory cells;
   a first circuit block that is disposed at at a first side of the memory cell array and which is configured to perform a first operation on the memory cells;
   a second circuit block that is disposed at a second side of the memory cell array and which is configured to perform second operation on the memory cells, wherein the second operation is different from the first operation, and wherein the first side is opposite the second side such that the memory cell array is located between the first and second circuit blocks; and
   a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block.

2. The nonvolatile memory device of claim 1, wherein the first operation is a write operation, and the second operation is a read operation.

3. The nonvolatile memory device method of claim 2, wherein before the first operation is started, the redundancy control signal is transferred to the first circuit block.

4. The nonvolatile memory device of claim 3, wherein the first circuit block includes a latch that stores the transferred redundancy control signal.

5. The nonvolatile memory device of claim 1, wherein the memory cell array comprises:
   a first global bit line for the first operation, and a second global bit line for the second operation;
   local bit lines selectively coupled to at least one of the first or second global bit lines; and a plurality of memory cells coupled to the local bit lines.

6. A nonvolatile memory device, comprising:
a memory cell array having a plurality of memory cells;
a first circuit block that is disposed at one side of the memory cell array and which is configured to perform a first operation on the memory cells;
a second circuit block that is disposed at the other side of the memory cell array and which is configured to perform second operation on the memory cells, wherein the second operation is different from the first operation; and
a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block,
wherein the redundancy control signal includes a first control signal generated by comparing input/output information included in the repair address with input/output information included in the input address.

7. The nonvolatile memory device of claim 6, wherein the first circuit block includes a write driver that is coupled to the repaired memory cell and is disabled by receiving the first control signal.

8. The nonvolatile memory device method of claim 6, wherein the first circuit block comprises:
a first decoder that decodes the input address and supplies a first decoding signal;
a latch that stores the first control signal;
a second decoder that receives the first decoding signal, and receives and decodes the first control signal stored in the latch and supplies a second decoding signal; and
a write driver that is coupled to the repaired memory cell and is disabled by the second decoding signal.

9. The nonvolatile memory device of claim 6, wherein the first circuit block comprises m input/output blocks where m is a natural number equal to or greater than 2, each of the input/output blocks including at least one write driver,
wherein a number of component signals of the first control signal is m, and
wherein the first circuit block comprises an input/output MUX that receives a plurality of write data, elects some of the plurality of write data according to the m first control signals, and supplies the selected write data to a redundancy write driver coupled to a redundancy memory cell corresponding to the repaired memory cell.

10. A nonvolatile memory device, comprising:
a memory cell array having a plurality of memory cells;
a first circuit block that is disposed at one side of the memory cell array and which is configured to perform a first operation on the memory cells;
a second circuit block that is disposed at the other side of the memory cell array and which is configured to perform second operation on the memory cells, wherein the second operation is different from the first operation; and
a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block,
wherein the redundancy control signal includes a plurality of second control signals generated using column address information included in the repair address.

11. The nonvolatile memory device of claim 10, wherein the first circuit block comprises a third decoder that decodes the plurality of second control signals and supplies a third decoding signal, and the memory cell array comprises a redundancy write global bit line selection circuit that is controlled by the third decoding signal.

12. The nonvolatile memory device of claim 10, wherein the first circuit block further comprises:
an operating unit that generates a third control signal using at least some of the plurality of second control signals; and
a redundancy write driver that is coupled to a redundancy memory cell corresponding to the repaired memory cell and is enabled in response to the third control signal.

13. A nonvolatile memory device, comprising:
a memory cell array having a plurality of memory cells;
a first circuit block that is disposed at one side of the memory cell array and which is configured to perform a first operation on the memory cells;
a second circuit block that is disposed at the other side of the memory cell array and which is configured to perform second operation on the memory cells, wherein the second operation is different from the first operation; and
a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block,
wherein the redundancy control signal includes a fourth control signal generated by comparing column address information included in the repair address with column address information included in the input address.

14. The nonvolatile memory device of claim 13, wherein the first circuit block is coupled to a redundancy memory cell corresponding to the repaired memory cell, and a redundancy write driver that is enabled in response to the fourth control signal.

15. A nonvolatile memory device, comprising:
a memory cell array having a plurality of memory cells;
a first circuit block that is disposed at one side of the memory cell array and which is configured to perform a first operation on the memory cells;
a second circuit block that is disposed at the other side of the memory cell array and which is configured to perform second operation on the memory cells, wherein the second operation is different from the first operation; and
a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block,
wherein the memory cell array is formed in a stack arrangement, and wherein the memory cell array is divided into a plurality of partitions which are formed in a stack arrangement.

16. A nonvolatile memory device, comprising:
a memory cell array having a plurality of memory cells;
a first circuit block that is disposed at one side of the memory cell array and which is configured to perform a first operation on the memory cells;
a second circuit block that is disposed at the other side of the memory cell array and which is configured to perform second operation on the memory cells, wherein the second operation is different from the first operation; and
a redundancy block that is disposed closer to the second circuit block than the first circuit block, and which is configured to compare a repair address of a repaired memory cell among the plurality of memory cells with an input address to then generate a redundancy control signal and to supply the redundancy control signal to the first circuit block and to the second circuit block,
wherein the memory cell is a phase-change memory cell.

17. A nonvolatile memory device comprising:
a memory cell array including a write global bit line, a read global bit line, local bit lines selectively coupled to the write global bit line and the read global bit line, and a plurality of memory cells coupled to the local bit lines;
a write block that is disposed at a first side of the memory cell array and coupled to the write global bit line and includes a latch;
a read block that is disposed at a second side of the memory cell array and is coupled to the read global bit line; and
a redundancy block that is disposed at an opposite side of the read block from the memory cell array, and which is configured to compare a repair address of a repaired memory cell among the plurality of memory cells with an input address, and to then generate a redundancy control signal and supply the redundancy control signal to the latch.

18. The nonvolatile memory device of claim 17, wherein the write block includes a write driver that is coupled to the repaired memory cell and is disabled by receiving the redundancy control signal.

19. The nonvolatile memory device of claim 17, wherein the write block comprises:
a first decoder that decodes the input address and supplies a first decoding signal;
a second decoder that receives the first decoding signal, and receives and decodes the first control signal stored in the latch, and supplies a second decoding signal; and
a write driver that is coupled to the repaired memory cell and is disabled by the second decoding signal.

20. The nonvolatile memory device of claim 17, wherein the memory cell array is formed in a stack arrangement, and wherein the memory cell array is divided into a plurality of partitions which are formed in a stack arrangement.

* * * * *